US006768628B2

(12) United States Patent
Harris et al.

(10) Patent No.: US 6,768,628 B2
(45) Date of Patent: Jul. 27, 2004

(54) METHOD FOR FABRICATING AN ISOLATED MICROELECTROMECHANICAL SYSTEM (MEMS) DEVICE INCORPORATING A WAFER LEVEL CAP

(75) Inventors: Richard D. Harris, Solon, OH (US); Michael J. Knieser, Richmond Heights, OH (US); Robert J. Kretschmann, Bay Village, OH (US); Mark A. Lucak, Hudson, OH (US)

(73) Assignee: Rockwell Automation Technologies, Inc., Mayfield Heights, OH (US)

( * ) Notice: Subject to any disclaimer, the term of this patent is extended or adjusted under 35 U.S.C. 154(b) by 0 days.

(21) Appl. No.: 09/842,975

(22) Filed: Apr. 26, 2001

(65) Prior Publication Data

US 2002/0159218 A1 Oct. 31, 2002

(51) Int. Cl.[7] .................................................. H01G 5/00

(52) U.S. Cl. ....................................... 361/277; 361/280

(58) Field of Search ................................ 361/277, 278, 361/280, 281

(56) References Cited

U.S. PATENT DOCUMENTS

| | | | |
|---|---|---|---|
| 3,886,447 | A | 5/1975 | Tanaka |
| 4,560,953 | A | 12/1985 | Bozio |
| 5,012,207 | A | 4/1991 | Edwards |
| 5,025,346 | A | 6/1991 | Tang et al. |
| 5,194,819 | A | 3/1993 | Briefer |
| 5,243,861 | A | 9/1993 | Kloeck et al. |
| 5,343,157 | A | 8/1994 | Deschamps |
| 5,359,893 | A | 11/1994 | Dunn |
| 5,413,668 | A | 5/1995 | Aslam et al. |
| 5,417,312 | A | 5/1995 | Tsuchitani et al. |
| 5,424,650 | A | 6/1995 | Frick |
| 5,491,604 | A | 2/1996 | Nguyen et al. |
| 5,536,988 | A | 7/1996 | Zhang et al. |
| 5,563,343 | A | 10/1996 | Shaw et al. |
| 5,572,057 | A | 11/1996 | Yamamoto et al. |
| 5,578,976 | A | 11/1996 | Yao |
| 5,585,311 | A | 12/1996 | Ko |
| 5,600,190 | A | 2/1997 | Zettler |
| 5,646,432 | A | 7/1997 | Iwaki et al. |
| 5,658,698 | A | 8/1997 | Yagi et al. |
| 5,761,350 | A | 6/1998 | Koh |
| 5,783,340 | A | 7/1998 | Farino et al. |
| 5,798,283 | A | 8/1998 | Montague et al. |
| 5,804,314 | A | 9/1998 | Field et al. |
| 5,815,051 | A | 9/1998 | Hamasaki et al. |

(List continued on next page.)

FOREIGN PATENT DOCUMENTS

| | | |
|---|---|---|
| EP | 0 665 590 A2 | 8/1995 |
| EP | 0 711 029 A2 | 5/1996 |
| EP | 0 763 844 A2 | 3/1997 |

OTHER PUBLICATIONS

Toumazou, C. et al., n–step Charge Injection Cancellation Scheme for Very Accurate Switched Current Circuits, Electronic Letters, V.30 (9) 680–681: 1994.

Emmerich, H., et al., A Novel Micromachined Magnetic–Field Sensor, MEMS 99 IEEE Conference, Jan. 17–21, 1999, IEEE Catalog No. 99ch36291c.

Madou, Marc, Fundamentals of Microfabrication, Chapters 2–4, CRC Press LLC, Boca Raton, FL: 1997.

*Primary Examiner*—Dean A. Reichard
*Assistant Examiner*—Eric Thomas
(74) *Attorney, Agent, or Firm*—Quarles & Brady LLP; Alexander M. Gerasimow; R. Scott Speroff

(57) ABSTRACT

A MEMS structure is provided having a cap that encapsulates and protects the fragile components of the device, while having an electrical trace embedded in a nonconductive substrate. The electrical trace includes a first terminal end that is exposed to the peripheral region of the device, and a second end that is connected to the MEMS structure to facilitate operation of the device.

80 Claims, 4 Drawing Sheets

U.S. PATENT DOCUMENTS

| | | | | |
|---|---|---|---|---|
| 5,834,864 | A | 11/1998 | Hesterman et al. | |
| 5,877,038 | A | 3/1999 | Coldren et al. | |
| 5,903,380 | A | 5/1999 | Motamedi et al. | |
| 5,920,978 | A | 7/1999 | Koshikawa et al. | |
| 5,943,155 | A | 8/1999 | Goossen | |
| 5,955,932 | A | 9/1999 | Nguyen et al. | |
| 5,959,516 | A | 9/1999 | Chang et al. | |
| 5,995,688 | A | 11/1999 | Aksyuk et al. | |
| 6,046,066 | A | 4/2000 | Fang et al. | |
| 6,060,336 | A | 5/2000 | Wan | |
| 6,071,426 | A | 6/2000 | Lee et al. | |
| 6,094,102 | A | 7/2000 | Chang et al. | |
| 6,100,477 | A | 8/2000 | Randall et al. | |
| 6,114,794 | A | 9/2000 | Dhuler et al. | |
| 6,116,756 | A | 9/2000 | Peeters et al. | |
| 6,127,767 | A | 10/2000 | Lee et al. | |
| 6,137,206 | A | 10/2000 | Hill | |
| 6,144,545 | A | 11/2000 | Lee et al. | |
| 6,149,190 | A | 11/2000 | Galvin et al. | |
| 6,159,385 | A | 12/2000 | Yao et al. | |
| 6,170,332 | B1 | 1/2001 | MacDonald et al. | |
| 6,188,322 | B1 | 2/2001 | Yao et al. | |
| 6,215,644 | B1 * | 4/2001 | Dhuler | 361/280 |
| 6,232,150 | B1 * | 5/2001 | Lin et al. | 438/119 |
| 6,232,841 | B1 | 5/2001 | Bartlett et al. | |
| 6,232,847 | B1 | 5/2001 | Marcy, 5th et al. | |
| 6,236,281 | B1 | 5/2001 | Nguyen et al. | |
| 6,257,705 | B1 | 7/2001 | Silverbrook | |
| 6,265,238 | B1 | 7/2001 | Yaji et al. | |
| 6,307,169 | B1 | 10/2001 | Sun et al. | |
| 6,316,278 | B1 | 11/2001 | Jacobsen et al. | |
| 6,348,788 | B1 | 2/2002 | Yao et al. | |
| 6,356,378 | B1 | 3/2002 | Huibers | |
| 6,356,689 | B1 | 3/2002 | Greywall | |
| 6,373,682 | B1 * | 4/2002 | Goodwin-Johansson | 361/278 |
| 6,384,353 | B1 | 5/2002 | Huang et al. | |
| 6,391,742 | B2 | 5/2002 | Kawai | |
| 6,400,009 | B1 * | 6/2002 | Bishop et al. | 257/704 |
| 6,411,214 | B1 | 6/2002 | Yao et al. | |
| 6,417,743 | B1 | 7/2002 | Mihailovich et al. | |
| 6,463,339 | B1 | 10/2002 | Vasko | |
| 6,465,929 | B1 | 10/2002 | Levitan et al. | |
| 6,466,005 | B1 | 10/2002 | Yao et al. | |
| 6,497,141 | B1 | 12/2002 | Turner et al. | |
| 6,504,356 | B2 | 1/2003 | Yao et al. | |

OTHER PUBLICATIONS

Kovacs, Gregory T.A., Micromachined Transducers Sourcebook, Table of Contents, pp. 77–119 and Index, WCB McGraw–Hill, U.S.A.: 1998.

Teegarden, Darrell et al., How to Model and Simulate Microgyroscope Systems, IEEE Spectrum, 66–75, Jul. 1998.

Emmerich, Harald et al., Magnetic Field Measurements with a Novel Surface Micromachined Magnetic–Field Sensor, IEEE Transactions on Electron Devices, V. 47 (5) 972–977, May 2000.

McGruer, N.E. et al., Electrostatically Actuated Microswitches; Scaling Properties, Solid–State Sensor and Actuator Workshop, Hilton Head Island, South Carolina, Jun. 8–11, 1998, pp. 132–135.

Miyajima, Hiroshi et al., High–Aspect–Ratio Photolithography for MEMS Applications, J. of Microelectromechanical Sys., V.4(4) 220–229, Dec. 1995.

Lu, Crist et al., A Monolithic Surface Micromachined Accelerometer with Digital Output, IEEE J. of Solid State Circuits, V. 30(12) 1367–1373, Dec. 1995.

Chen, Ming–Jer et al., Weak Inversion Charge Injection in Analog MOS Switches, IEEE J. of Solid–State Circuits, V. 30 (5) 604–606, May 1995.

Lemkin, mark A. et al., A Fully Differential Lateral S? Accelerometer with Drift Cancellation Circuitry, Solid–State Sensor and Actuator Workshop, Hilton Head, South Carolina, Jun. 2–6, 1996, pp. 90–93.

Boser, Bernhard E. et al., Surface Micromatched Accelerometers, IEEE J. of Solid–State Circuits, V. 31 (3) 366–375, Mar. 1996.

Fedder, Gary K. et al., Multimode Digital Control of a Suspended Polysilicon Microstructure, J. of Microelectromechanical Sys., V. 5 (4) 283–297, Dec. 1996.

Noriega, Gerardo, Sigma–Delta A/D Converters–Audio and Medium Bandwidths, Technical Notes–DT3 from RMS Instruments website: www.rmsinst.com, 6 pages, Feb. 1996.

Internet page: Decimator Filter DLL, NeuroDimension Inc., www.nd.com, May 31, 2001.

Storment, C.W., et al. "Flexible, Dry–Released Process for Aluminum Electrostatic Actuators," Journal of Microelectromechanical Systems, 3(3), Sep. 1994, p 90–96.

* cited by examiner

METHOD FOR FABRICATING AN ISOLATED MICROELECTROMECHANICAL SYSTEM (MEMS) DEVICE INCORPORATING A WAFER LEVEL CAP

CROSS-REFERENCE TO RELATED APPLICATIONS

BACKGROUND OF THE INVENTION

1. Field of the Invention

The present invention relates to microelectromechanical systems (MEMS) and, in particular, relates to the fabrication of MEMS components having a protective wafer level cap.

2. Discussion of the Related Art

Microelectromechanical system (MEMS) components are being progressively introduced into many electronic circuit applications and a variety of micro-sensor applications. Examples of MEMS components are electromechanical motors, radio frequency (RF) switches, high Q capacitors, pressure transducers and accelerometers. In one application, the MEMS structure is an accelerometer having a movable component that, in response to an external stimulus, is actuated so as to vary the size of a capacitive air gap. Accordingly, the capacitance output of the MEMS structure provides an indication of the strength of the external stimulus.

One method of fabricating such components, often referred to as surface micro-machining, uses a sacrificial layer such as silicon dioxide that is deposited onto a substrate which is generally single crystal silicon which has been covered with a layer of silicon nitride. A MEMS component material, polycrystalline silicon by way of example, is then deposited onto the sacrificial layer. The silicon layer is then patterned by standard photolithographic techniques and then etched by a suitable reactive ion etching plasma or by wet chemistry to define the MEMS structure and to expose the sacrificial silicon dioxide layer. The sacrificial layer is then etched to release the MEMS component. Such etching and patterning are well known by those having ordinary skill in the art, and are described, for example, in M. Madou, *Fundamentals of Microfabrication*, (CRC Press, Boca Raton, 1997), or G. T. A. Kovacs, *Micromachined Transducers Sourcebook*, (WCB McGraw-Hill, Boston, 1998).

It is often desirable to integrate a MEMS structure with an integrated circuit into a single package or onto a single chip. However, many materials are used when fabricating an integrated circuit and during the packaging process, such as water, photoresist, dopants, coatings, etchants, epoxies, etc. The nature of MEMS structures with their inherent mechanical motion is such that the introduction of any of these materials into the structure will most likely render it inoperative. The microscopic mechanical MEMS structure may further be damaged by dirt finding its way into the structure during packaging and handling of the MEMS structure or of the integrated MEMS/circuit pair. Accordingly, a method and apparatus for protecting the MEMS structure from these potential contaminants are desirable.

What is therefore needed is a method for encapsulating a MEMS structure to protect the device from harmful contaminants and other hazards while still allowing an external electrical connection to the device.

BRIEF SUMMARY OF THE INVENTION

The present inventors have recognized that a cap may be bonded to a substrate so as to encapsulate a MEMS structure and provide a seal to protect the device from contaminants and other hazards.

In accordance with a first aspect of the invention, a MEMS structure includes a substrate, at least one conductive element that is in mechanical communication with the substrate and that extends therefrom, a movable MEMS element free from the substrate and positioned such that a gap separates the movable MEMS element from the at least one conductive element, at least one electrical trace having a first terminal end in electrical communication with the at least one conductive element and a second terminal end in electrical communication with a peripheral region, and a cap attached to the substrate inside the peripheral region having upper and side walls that encapsulate the at least one conductive element and the movable MEMS element.

These and other aspects of the invention are not intended to define the scope of the invention for which purpose claims are provided. In the following description, reference is made to the accompanying drawings, which form a part hereof, and in which there is shown by way of illustration, a preferred embodiment of the invention. Such embodiment also does not define the scope of the invention and reference must be made therefore to the claims for this purpose.

BRIEF DESCRIPTION OF THE DRAWINGS

Reference is hereby made to the following figures in which like reference numerals correspond to like elements throughout, and in which.

DETAILED DESCRIPTION OF THE INVENTION

Figure 1:
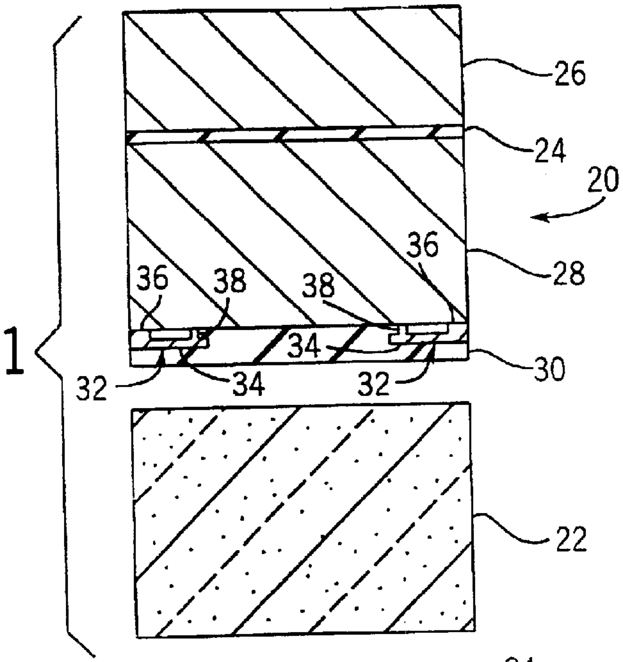
FIG. 1 is a sectional side elevation view of a schematic illustration of a wafer having conductive fingers disposed therein constructed in accordance with the preferred embodiment and a substrate.

Referring initially to FIG. 1, the components of a MEMS structure constructed in accordance with the preferred embodiment include a silicon-on-insulator (SOI) wafer 20 and a substrate 22. SOI wafers of this nature are readily available commercially from manufacturers such as Shin-Etsu Handotai Co., Ltd., located in Japan. The wafer 20 includes a layer of silicon dioxide 24 that is disposed between an upper and lower layer of the silicon 26 and 28, respectively. However, as is apparent to those having ordinary skill in the art, the presence of the silicon dioxide layer 24 is not necessary for this invention, although its presence facilitates the controlled removal of layer 26 to leave a conductive layer 28 with a uniform and well-defined thickness, as will become more apparent from the description below.

A second layer of nonconductive silicon dioxide 30 is deposited onto the lowermost layer of silicon 28, and encapsulates a pair of conductive fingers 32 having first and second electrical leads 38 and 36. First lead 38 is connected via spanner member 34 to the second lead 36, which forms an electrical connection to a peripheral region of wafer 20, as will become more apparent from the description below. As the silicon dioxide layer 30 provides insulation for the conductive fingers 32 in accordance with the preferred embodiment, it should be appreciated in this regard that layer 30 could alternatively comprise any suitable generic layer that is nonconductive.

Figure 2A:
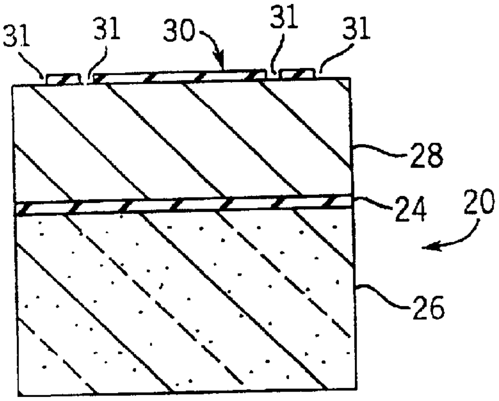
FIG. 2*a* is a sectional side elevation view of the wafer illustrated in FIG. 1 after silicon dioxide layer deposition and photolithographic definition and etching to form vias therein.

Referring now to FIG. 2*a*, the conductive fingers 32 are formed within the silicon dioxide layer 30 by first depositing the second layer of nonconductive silicon dioxide 30 onto the layer of silicon 28 using a standard process such as plasma enhanced chemical vapor deposition (PECVD). This layer 30 is then patterned by standard photolithographic and etching procedures using either wet chemistry or plasma etching, as is appreciated by those having ordinary skill in the art, to produce voids 31 that are disposed therein. In accordance with the preferred embodiment, the voids 31 extend through to layer 28, though the present invention includes voids of any size or shape that produce conductive fingers having two leads that are electrically connected and that facilitate the electrical connection of the conductive element of a MEMS structure to the peripheral region, as will become more apparent from the description below.

Figure 2B:
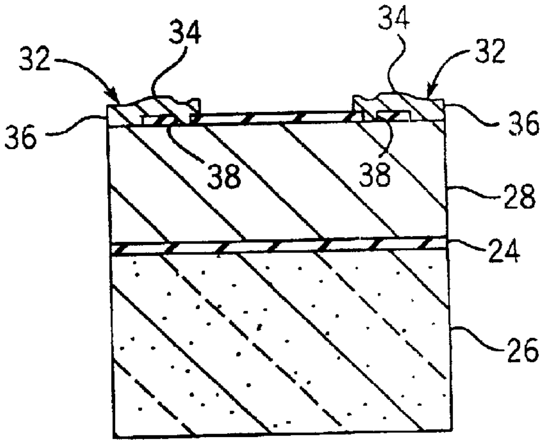
FIG. 2*b* is a sectional side elevation view of the wafer illustrated in FIG. 2*a* after conductive polycrystalline silicon or metal deposition and photolithographic definition and etching to form the conductive fingers illustrated in FIG. 1.

Referring now to FIG. 2*b*, voids 31 will form vias that receive the deposition of a conductive material that will ultimately form the conductive fingers 32. The conductive material could be highly doped poly-silicon, a refractory metal such as tungsten, titanium, nickel, and alloys thereof or any other conductive material that will withstand the subsequent processing steps. If only low temperature steps are to follow, then a lower temperature metal, such as aluminum, could be used as the conductive material. A sufficient amount of conductive material is deposited to form the first and second leads 38 and 36.

Figure 2C:
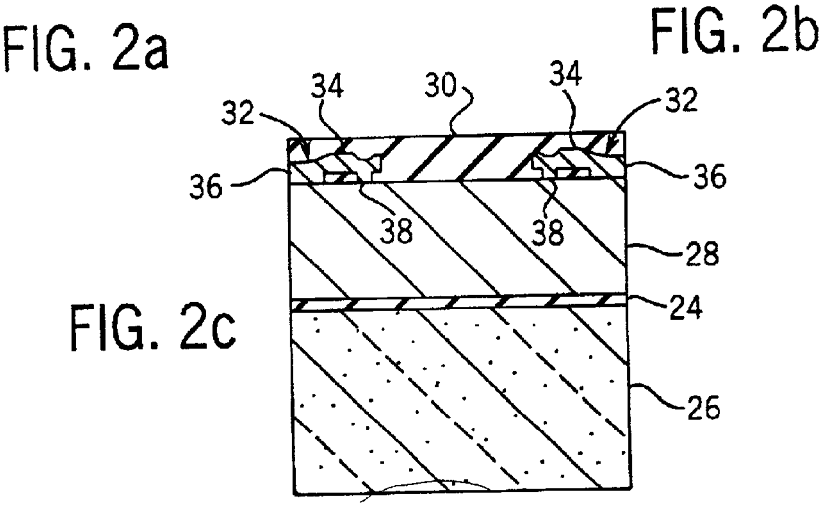
FIG. 2*c* is a sectional side elevation view of the wafer illustrated in FIG. 2*b* after silicon dioxide deposition and planarization.

Referring now to FIG. 2*c*, after the conductive layer is patterned, additional silicon dioxide is added to layer 30 so as to extend beyond the upper surface of spanner members 34 in accordance with the preferred embodiment. The surface of layer 30 is then planarized using, for example, a standard chemical-mechanical-planarization (CMP) process. The planarization may produce an upper surface comprising silicon dioxide, or layer 30 could be planarized to expose the conductive material. If the substrate is insulating, there will be no loss of isolation if the electrical traces 32 are in contact with the substrate when layer 30 is bonded to the substrate, as will be described in more detail below. It should be further appreciated that a layer of aluminum 33 (shown in phantom in FIG. 4) may be patterned onto the lower surface of layer 28 and aligned with that portion of wafer 20 which will ultimately form the conductive and movable MEMS elements. The aluminum will thereby be in electrical contact with both the conductive element and lead 38 of electrical trace 32.

Figure 3:
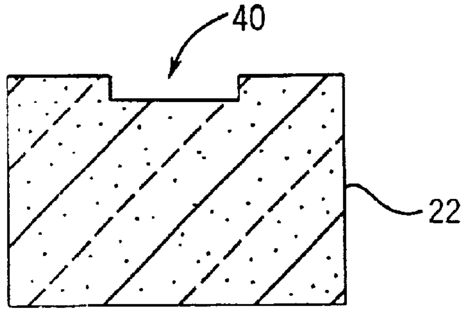
FIG. 3 is a sectional side elevation view of the substrate illustrated in FIG. 1 after photolithographic definition and etching.

Referring now to FIG. 3, the substrate 22 may comprise glass or any other insulating material, including high resistivity silicon, crystalline sapphire, or ceramic such as alumina, aluminum nitrite, and the like. It should be appreciated that the substrate 22 does not necessarily have to be insulating since as described above, a sufficient amount of silicon dioxide was added to layer 30 so as to form an interface between the wafer 20 and substrate 22 that will prevent the electrical traces 32 from contacting the substrate. However, the use of an insulating substrate 22 would be desirable to achieve additional insulation, or if the nonconductive layer 30 illustrated in FIG. 2*c* was planarized such that spanner members 34 were exposed. If material 30 provides sufficient isolation by itself, a more conducting substrate such as crystalline silicon could be used.

Referring still to FIG. 3, a recess 40 is formed in the upper surface of the substrate 22 by placing photoresist on the substrate and patterning it so that when etched, the portion of the substrate having the photoresist disposed thereon will remain intact, while the exposed material will be removed. Accordingly, to form the recess 40 in the middle portion of the upper surface of the substrate 22, the photoresist is patterned so as to remain on the outer portions of the upper surface, and the substrate 22 is etched using a plasma etch or wet chemistry etch suitable for the material composition of the substrate, as is understood by those having ordinary skill in the art. The photoresist is then removed using the appropriate solvent for the photoresist material used. While the recess 40 is shown as being anisotropically etched in the figures, it should be appreciated that the invention includes an isotropic etching of the recess 40. The depth of recess 40 is chosen to be sufficiently large so as to enable a movable portion of the fabricated MEMS structure to release from the substrate 22 after fabrication, as will be described in more detail below. It should be appreciated that other methods exist for releasing the movable portion from the substrate, as described in a patent application entitled "Method for Fabricating an Isolated Micro-Electromechanical System Device Using an Internal Void" filed on even date herewith, the disclosure of which is hereby incorporated by reference as if set forth in its entirety herein.

Figure 4:
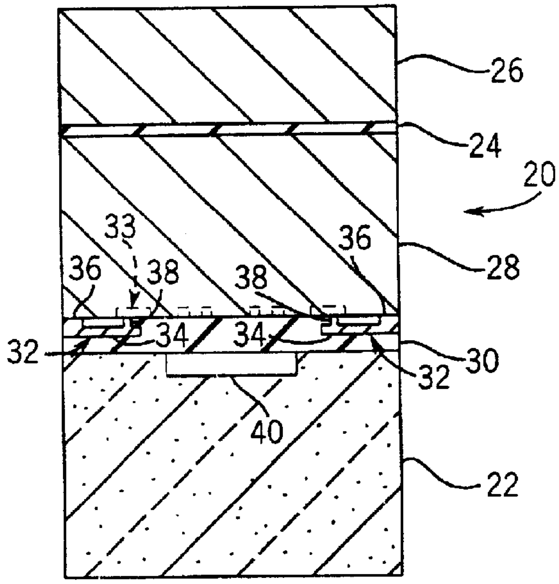
FIG. 4 is a sectional side elevation view of the wafer bonded to the substrate of FIG. 3 to form a composite structure.

Referring now to FIG. 4, the silicon dioxide layer of the wafer 20 is bonded to the upper surface of the substrate 22. In particular, the wafer 20 is positioned above the insulating substrate 22, and is bonded thereto via a high temperature fusion bonding process, or any other suitable process, as is known to those having ordinary skill in the art. Alternatively, any other suitable bonding method may be used such as epoxy, glass frit, soldering and the like. Depending on the material composition of the substrate 22, an additional layer, such as silicon dioxide or other suitable material, may need to be grown or deposited onto the upper surface thereof prior to the bonding step in order to provide a suitable layer to bond with the silicon dioxide layer 30 disposed on the bottom of wafer 20.

Figure 5:
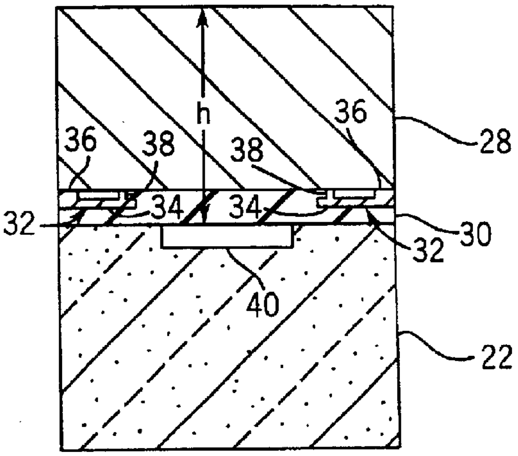
FIG. 5 is a sectional side elevation view of the composite structure illustrated in FIG. 4 with a portion of the wafer removed.

Referring now to FIG. 5, layer 26 of wafer 20 is removed from the top using one of many methods known by those having ordinary skill in the art. In accordance with the preferred embodiment, the substrate is ground and polished until approximately 100 $\mu$m of layer 26 remains, and the remaining silicon is etched in tetramethylammonium hydroxide (TMAH) to expose the silicon dioxide layer 24 which serves as an etch stop. The silicon dioxide layer 24 is then removed by etching with hydrofluoric acid. The layer 28 remains with just the desired uniform thickness, it being appreciated that the final height h of the wafer 20 will correspond generally to the desired height of the resulting fabricated MEMS structure, as will be described in more detail below. If desired, additional silicon from layer 28 may also be removed, making sure to maintain a uniform thickness of the desired height h of the wafer 20.

It should be appreciated, however, that the invention anticipates that a standard silicon wafer could be provided and etched to a desired height. However, achieving a generally uniform height in a silicon wafer can be difficult to achieve, as such wafers do not have an etch stop, such as layer 24 in the SOI wafer 20. It may nonetheless be desirable to use such standard wafers in accordance with the present invention if large volume production were desired. Such wafers may comprise silicon, silicon carbide, gallium arsenide, a high temperature metal, or alternative conductive materials suitable to withstand the subsequent fabrication processes.

An SOI wafer 20 is provided in accordance with the preferred embodiment because commercially available SOI wafers are available that differ in thickness. As a result, it is likely that a wafer may be selected whose silicon layer 28 has a height that corresponds to the desired height of the resulting fabricated MEMS structure.

Figure 6:
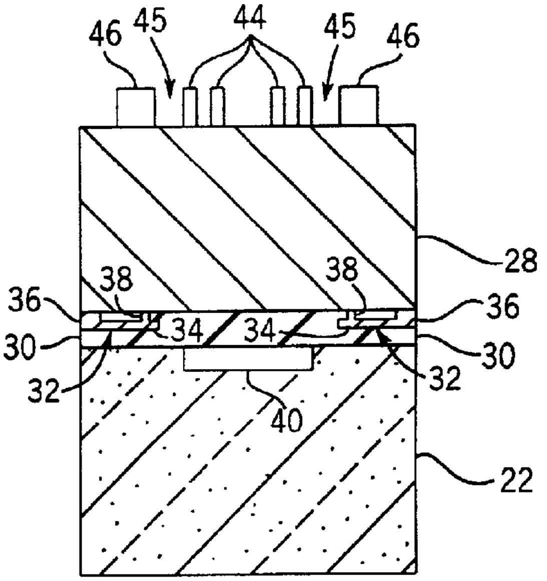
FIG. 6 is a sectional side elevation view of the composite structure illustrated in FIG. 5 having photoresist applied thereto.

Next, referring to FIG. 6, the silicon MEMS layer 28 is etched by first depositing and photolithographically patterning photoresist on the upper surface thereof. In particular, a photoresist layer is deposited and patterned to leave inner and outer photoresist members 44 and 46, such that outer photoresist members 46 are aligned with the corresponding first lead 38 of the electrical trace 32 to ultimately provide an electrical connection for the MEMS structure in accordance with the preferred embodiment. Alternatively a silicon dioxide layer 38 may be deposited using the PECVD process, or other well-known methods, instead of photoresist to provide a mask for future etching procedures. Additionally, a gap 45, disposed between members 44 and 46, is at least partially aligned with recess 40. The recess 40 is disposed in the substrate 22 so as to allow the MEMS structure to be released from the substrate 22 upon etching. Accordingly, layer 28 is etched into the recess, thereby releasing a movable inner MEMS element 52 (shown in FIG. 7), as will be described in more detail below. It should be appreciated that FIG. 6 is a schematic illustration whose purpose is to illustrate the conceptual placement of the photoresist in relation to the electrical traces 32 and recess 40, and could assume any configuration whatsoever that would produce a suitable MEMS structure.

Figure 7:
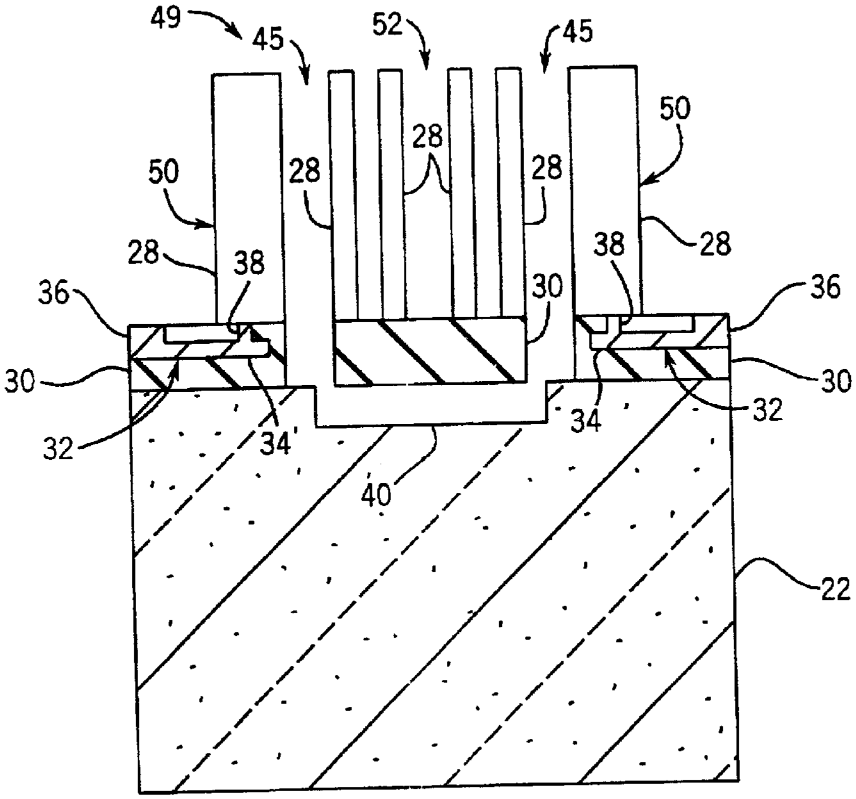
FIG. 7 is a sectional side elevation view of the composite structure illustrated in FIG. 6 after photolithographic definition and etching of silicon and silicon dioxide layers and photoresist removal.

Referring now to FIG. 7, the silicon layer 28 is anisotropically dry etched using a deep reactive ion etching (DRIE) process, as is understood by those having ordinary skill in the art. The etching continues until all silicon has been anisotropically etched, thereby producing outer stationary MEMS elements 50, which are termed "stationary" because they are attached to substrate 22 (albeit indirectly via layer 30). Next, the remaining photoresist is removed and a new layer of photoresist is deposited and patterned so as to define the desired structure of the silicon dioxide layer 30.

It is therefore apparent that one reason that layer 28 comprises silicon, and that layer 30 comprises silicon dioxide, is because they are selectively etchable from one another, thereby facilitating the controlled patterning of both layers. It should therefore be appreciated that layers 28 and 30 could comprise any material whatsoever having the desired conductive (or nonconductive) characteristics and that are selectively etchable and suitable to be used in the construction of a MEMS structure.

Next, the silicon dioxide layer 30 is anisotropically etched by reactive ion etching (RIE) using fluoroform or other etchant. Once the remaining photoresist is removed, the resulting product is a MEMS structure 49 having the movable inner MEMS element 52 comprising electrically conducting and electrically insulating components 28 and 30, respectively, that are released from the substrate 22 and free from the stationary outer MEMS elements 50 with a defined variable size gap 45 therebetween. In particular, the insulating component 30 for element 52 provides a base for the conducting components 28. Alternatively, the inner MEMS element could be constructed having a silicon base, as described in a patent application entitled "Method for Fabricating a MicroElectromechanical System (MEMS) Device Using a Pre-Patterned Substrate" filed on even date herewith, the disclosure of which is hereby incorporated by reference as if set forth in its entirety herein. It should be appreciated that the base could also be formed during the formation of fingers 32 and electrical leads 36 and 38.

Because the electrical traces 32 comprise a conductive material, or refractory metal in accordance with the preferred embodiment, an electrical connection is established between the stationary conductive elements 50 and the peripheral region via first and second terminals 38 and 36, respectively. The MEMS structure 49 could therefore perform any function suitable for a MEMS application. For example, the structure 49 could comprise an accelerometer whose movable MEMS element 52 is a cantilever beam that deflects in response to external stimuli, such as an acceleration or vibration of the structure. Accordingly, as the size of the gap 45 between the stationary conductive elements 50 and the movable MEMS element 52 varies, so will the output capacitance, thereby providing a measurement of the amount of deflection of the movable MEMS element 52.

While the MEMS structure 49 constructed in accordance with the preferred embodiment is illustrated having inner movable elements 52 and outer stationary elements 50, it is easily appreciated that a MEMS structure could be constructed in accordance with the present invention whose movable elements are disposed outwardly of the stationary elements, so long as a gap exists between the movable and stationary elements to allow the capacitance to be measured, which varies as a function of the size of the gap such that deflection of the movable element with respect to the stationary element may be adequately determined. It should be easily appreciated that the present invention is equally applicable to any suitable MEMS structure.

Figure 8:
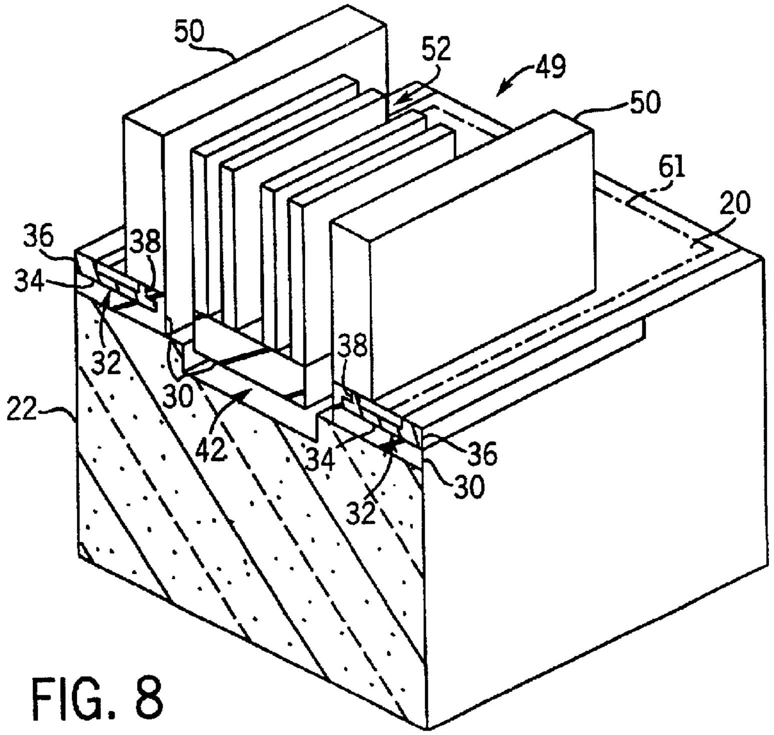
FIG. 8 is a perspective view of the schematic structure illustrated in FIG. 7.

As shown in FIG. 8, the MEMS structure 49 is exposed to the ambient environment. Accordingly, the structure 49 is subject to exposure to various contaminants and solvents that are used during subsequent handling such as structure singulation or when integrating with an integrated circuit. For example, the sensitivity of the structure 49 is such that the introduction of liquid into the immediate environment of the MEMS structure may cause the movable MEMS element 52 to deflect, thereby skewing the electrical output. In extreme cases, the introduction of liquid will cause the movable MEMS element 52 to bond with the stationary conductive elements 50, thereby rendering the structure 49 wholly inoperative. It is therefore important to protect the structure 49 from such hazards while, at the same time, establishing an electrical connection between the stationary conductive elements 50 and the peripheral region.

It should be appreciated by one having ordinary skill in the art that FIG. 8 illustrates a portion of a MEMS structure 49, it being appreciated that inner MEMS element 52 is connected to substrate 22 at its two distal ends, as disclosed in a patent application filed on Mar. 13, 2001 and entitled "Microelectricalmechanical System (MEMS) Electrical Isolator with Reduced Sensitivity to Internal Noise" the disclosure of which is hereby incorporated by reference. For example, the void 40 that is disposed in substrate 22 may terminate, thereby connecting element 52 to the substrate. In accordance with the preferred embodiment, an elongated section of element 52 is suspended and free from the substrate, thereby permitting deflection of the free portion of the movable MEMS element with respect to the substrate 22. An electrical trace may be connected to the movable element 52 at these connection locations.

In prior art designs, wire leads are directly attached to the stationary conductive elements 50 of a MEMS structure to render the device operational. However, such an arrangement is incapable of allowing the entire MEMS structure to be protected from the aforementioned hazards. For example, a protective cap could not be installed in this arrangement due to interference with the wire leads.

In accordance with the preferred embodiment, a wire may be connected to terminal 36 so as to place the stationary conductive elements 50 in electrical communication with the peripheral region, while at the same time removing any interference and thereby allowing a protective cap 53 to be placed on the substrate 22 and positioned at a bonding location 61, identified by the dotted lines on FIG. 8. The bonding location is disposed between the first terminal end 38 and the second terminal end 36 so that the first terminal end is exposed to the peripheral region 63 while the second end is in electrical communication with the protected stationary MEMS elements 50. It should be appreciated that the cap may comprise any material, either conducting or nonconducting, that is capable of providing the desired protection for the MEMS structure 49.

Figure 9:
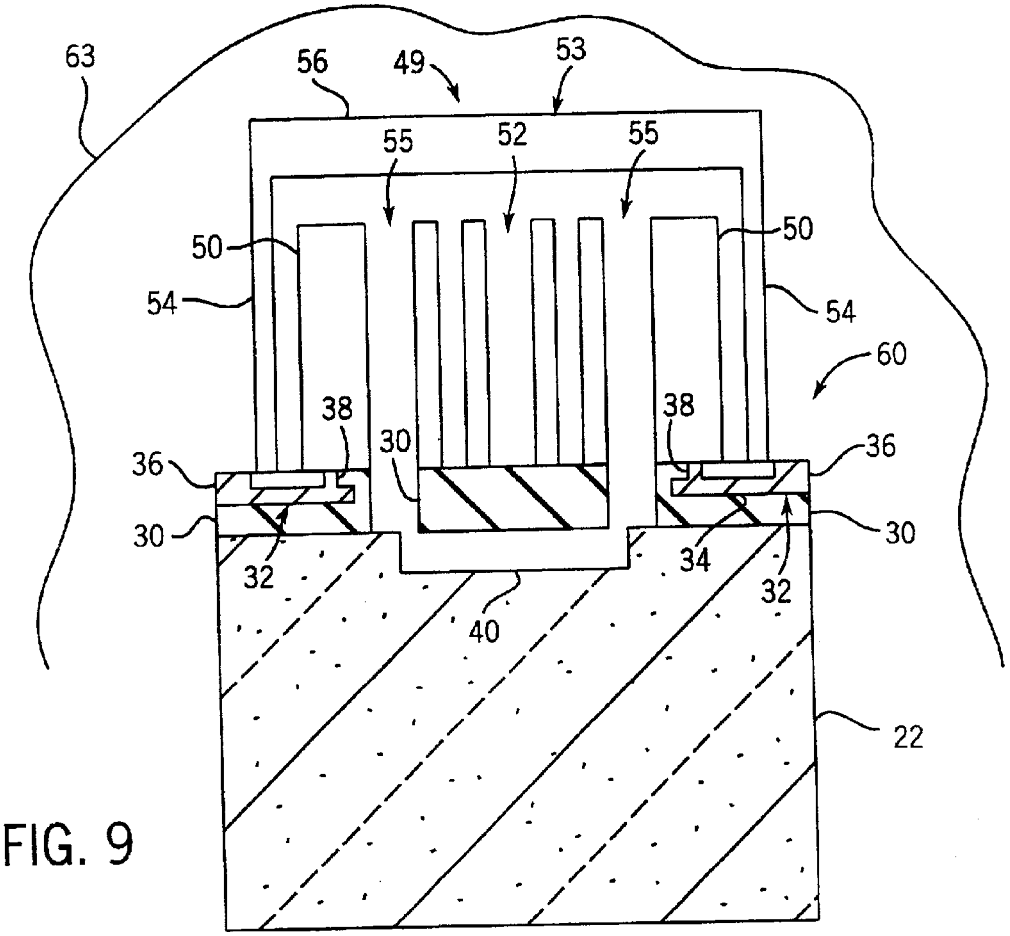
FIG. 9 is a sectional side elevation view of the structure illustrated in FIGS. 7 and 8 having a protective cap attached thereto.

In particular, referring also to FIG. 9, the cap 53 is optically aligned with the wafer 20, and that it is bonded thereto using a suitable glass frit process, soldering process, or other bonding process as understood by those having ordinary skill in the art. FIG. 9 therefore illustrates the final device, including a protected MEMS structure 60 having a cap 53, sidewalls 54, and a height greater than the height of the stationary conductive element 50 and movable MEMS element 52. A horizontal roof 56 is attached at each end to the sidewalls 54, and end walls (not shown) are added to completely encapsulate and protect the MEMS structure 49. The cap 53 spans the entire depth of the MEMS structure 49 to completely prevent contaminants from entering the structure during subsequent processing, handling, or packaging. Additionally, the cap 53 protects the MEMS structure 49 during handling and packaging of the integrated circuit. Again, it may be observed in FIG. 9 that the stationary conductive elements 50 may be electrically connected to the peripheral region via leads 38 and 36 of the electrical trace 32. It should be appreciated in this regard that the electrical trace 32 may assume any configuration whatsoever so long as it is insulated and connected to the stationary conductive element 50 at one end, and the peripheral region at another end.

Figure 10:
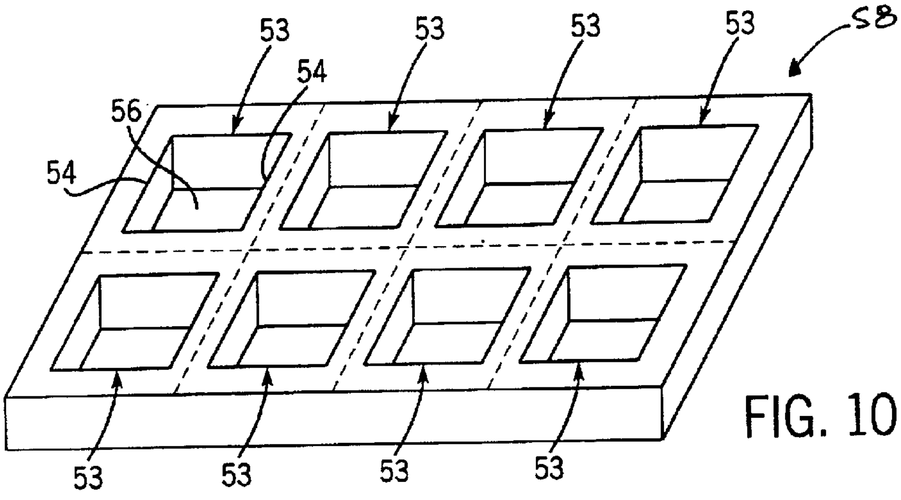
FIG. 10 is a perspective view of a plurality of mass produced caps that are configured to be installed in corresponding MEMS structures in accordance with the preferred embodiment.

Referring to FIG. 10, a wafer 58, or blank, is illustrated having a plurality of caps 53 disposed therein. The cap wafer may be fabricated by a patterning and etching process, or any other process appropriate to the cap material, with methods understood by those having ordinary skill in the art. Accordingly, a plurality of caps may be mounted onto a corresponding plurality of MEMS structures 49 and subsequently separated, thereby facilitating the mass production of protected MEMS structures 60 in a single operation in accordance with the preferred embodiment.

The above has been described as a preferred embodiment of the present invention. It will occur to those that practice the art that many modifications may be made without departing from the spirit and scope of the invention. In order to apprise the public of the various embodiments that may fall within the scope of the invention, the following claims are made.

We claim:

1. A MEMS structure comprising:

a substrate;

at least one conductive element that is in mechanical communication with the substrate and that extends therefrom;

a movable MEMS element having a portion that is free from the substrate and positioned such that a gap separating the movable MEMS element from the at least one conductive element defines a variable-sized dimension extending substantially parallel to the substrate;

at least one electrical trace having a first terminal end in electrical communication with the at least one conductive element and a second terminal end in electrical communication with a peripheral region; and a cap attached to the substrate inside the peripheral region having upper and side walls that encapsulate the at least one conductive element and the movable MEMS element.

2. The MEMS structure as recited in claim 1, wherein the cap is non-conductive.

3. The MEMS structure as recited in claim 2, wherein the cap is selected from the group consisting of glass, high resistivity silicon, crystalline sapphire, and ceramic.

4. The MEMS structure as recited in claim 1, wherein the cap is conductive.

5. The MEMS structure as recited in claim 4, wherein the cap is selected from the group consisting of silicon and metal.

6. The MEMS structure as recited in claim 1, wherein the at least one electrical trace is selected from the group consisting of doped polysilicon, and a metal.

7. The MEMS structure as recited in claim 6, wherein the metal is selected from the group consisting of tungsten, titanium, nickel, and alloys thereof, and aluminum, copper, silver, and gold.

8. The MEMS structure as recited in claim 1, wherein a bottom surface of at least one of the side walls of the cap is attached to the substrate.

9. The MEMS structure as recited in claim 1, wherein the sidewalls are connected to the substrate at a location between first and second terminal ends of the at least one electrical trace.

10. The MEMS structure as recited in claim 1, wherein the at least one electrical trace is disposed within an interface between the at least one conductive element and the substrate.

11. The MEMS structure as recited in claim 1, wherein the substrate comprises a nonconductive material.

12. The MEMS structure as recited in claim 11, wherein a portion of the at least one electrical trace is in electrical communication with the substrate.

13. The MEMS structure as recited in claim 1, wherein the substrate comprises a conductive material.

14. The MEMS structure as recited in claim 1, wherein the substrate further comprises a recess formed in the upper surface thereof.

15. The MEMS structure as recited in claim 14, wherein the movable MEMS element is disposed above and substantially aligned with the recess.

16. The MEMS structure as recited in claim 1, wherein the movable MEMS element comprises at least one conductive member attached to a nonconductive base.

17. The MEMS structure as recited in claim 16, wherein the nonconductive base is selectively etchable from the conductive member.

18. The MEMS structure as recited in claim 16 wherein the nonconductive base comprises one of silicon dioxide and silicon nitride.

19. The MEMS structure as recited in claim 1, wherein the substrate is selected from the group consisting of high resistivity silicon, crystalline sapphire, glass and ceramic.

20. The MEMS structure as recited in claim 1, wherein the substrate is selected from the group consisting of silicon, silicon carbide, gallium arsenide, and metal.

21. The MEMS structure as recited in claim 1, wherein the at least one conductive element is selected from the group consisting of silicon, silicon carbide, and gallium arsenide.

22. A MEMS structure disposed within a peripheral region comprising:

a substrate;

a movable MEMS element having outer ends permanently connected to the substrate, and a middle portion connected between the outer ends and free from the substrate;

a stationary conductive MEMS element in mechanical communication with the substrate and disposed adjacent the movable MEMS element, wherein a gap is disposed between the middle portion and the stationary conductive MEMS element, and wherein the gap defines a variable-sized dimension extending substantially parallel to the substrate; and a cap attached to the substrate having upper and side walls that encapsulate the stationary conductive MEMS element and the movable MEMS element.

23. The MEMS structure as recited in claim 22, wherein the cap separates the MEMS structure from the peripheral region, the MEMS structure further comprising:

at least one electrical trace having a first terminal end in electrical communication with the stationary conductive MEMS element and a second terminal end in electrical communication with the peripheral region.

24. The MEMS structure as recited in claim 23, further comprising:

a second stationary MEMS element in mechanical communication with the substrate and disposed adjacent the movable MEMS element; and a second electrical trace having a first terminal end in electrical communication with the second stationary MEMS element and a second terminal end in electrical communication with the peripheral region.

25. The MEMS structure as recited in claim 24, wherein the stationary MEMS elements are electrically isolated from each other.

26. The MEMS structure as recited in claim 22, wherein the movable MEMS element further comprises at least two conductive elements.

27. The MEMS structure as recited in claim 26, wherein the at least two conductive elements are electrically isolated from each other.

28. A MEMS structure surrounded by a peripheral region, the MEMS structure comprising:

a substrate;

at least one stationary conductive element that is in mechanical communication with the substrate;

a movable MEMS element disposed adjacent the at least one stationary conductive element, and having outer ends permanently connected to the substrate, and a middle portion connected between the outer ends and free from the substrate; and at least one electrical trace having a first terminal end in electrical communication with the at least one stationary conductive element and a second terminal end in electrical communication with the peripheral region, wherein the at least one electrical trace is disposed within an electrically insulating interface between the at least one conductive MEMS element and the substrate.

29. The MEMS structure as recited in claim 28, further comprising a cap attached to the substrate inside the peripheral region having upper walls and side walls that encapsulate the at least one stationary element and the movable MEMS element.

30. The MEMS structure as recited in claim 29, wherein the second terminal extends outside the cap.

31. A MEMS structure surrounded by a peripheral region, the MEMS structure comprising:

a substrate extending along a lateral direction;

first and second stationary conductive elements in mechanical communication with the substrate;

a movable MEMS element disposed laterally adjacent the stationary conductive elements, and having outer ends permanently connected to the substrate, and a middle portion connected between the outer ends and free from the substrate; and first and second electrical traces having first terminal ends in electrical communication with the first and second stationary elements, respectively, and having second terminal ends in electrical communication with the peripheral region, wherein each trace is disposed within an electrically insulating interface between the substrate and the stationary conductive elements.

32. The MEMS structure as recited in claim 31, further comprising a cap attached to the substrate inside the peripheral region having upper walls and side walls that encapsulate the stationary conductive elements and the movable MEMS element.

33. The MEMS structure as recited in claim 32, wherein the second terminal ends extend outside the cap.

34. The MEMS structure as recited in claim 33, wherein the second terminal ends are electrically isolated from each other.

35. The MEMS structure as recited in claim 31, wherein the movable MEMS element further comprises at least two conductive elements.

36. The MEMS structure as recited in claim 35, wherein the at least two conductive elements are electrically isolated from each other.

37. A MEMS structure comprising:

a substrate;

at least one conductive element that is in mechanical communication with the substrate and that extends therefrom;

a movable MEMS element having a portion that is free from the substrate and positioned such that a gap separates the movable MEMS element from the at least one conductive element;

at least one electrical trace having a first terminal end in electrical communication with the at least one conductive element and a second terminal end in electrical communication with a peripheral region; and a cap attached to the substrate inside the peripheral region having upper and side walls that encapsulate the at least one conductive element and the movable MEMS element, wherein the at least one electrical trace is disposed within an electrically insulating interface between the at least one conductive MEMS element and the substrate.

38. The MEMS structure as recited in claim 37 wherein the interface prevents any portion of the at least one electrical trace from being in electrical communication with the substrate.

39. The MEMS structure as recited in claim 37 wherein the interface layer comprises one of silicon dioxide and silicon nitride.

40. The MEMS structure as recited in claim 37 wherein the movable MEMS element has outer ends permanently connected to the substrate, wherein the portion free from the substrate is connected between the outer ends.

41. The MEMS structure as recited in claim 37 wherein the gap defines a variable-sized dimension that extends substantially parallel to the substrate.

42. A MEMS structure comprising:

a substrate;

at least one stationary conductive element that is in mechanical communication with the substrate and that extends therefrom;

a movable MEMS element having outer ends permanently connected to the substrate and a middle portion connected between the outer ends that is free from the substrate and positioned such that a gap separates the movable MEMS element from the at least one conductive element, wherein the gap defines a variable-sized dimension extending substantially parallel to the substrate;

at least one electrical trace having a first terminal end in electrical communication with the at least one stationary conductive element and a second terminal end in electrical communication with a peripheral region; and a cap attached to the substrate inside the peripheral region having upper and side walls that encapsulate the at least one stationary conductive element and the movable MEMS element.

43. The MEMS structure as recited in claim 42, wherein the electrical trace is disposed within an electrically insulating layer between the stationary conductive element and the substrate.

44. The MEMS structure as recited in claim 42, wherein the cap is non-conductive.

45. The MEMS structure as recited in claim 44, wherein the cap is selected from the group consisting of glass, high resistivity silicon, crystalline sapphire, and ceramic.

46. The MEMS structure as recited in claim 42, wherein the cap is conductive.

47. The MEMS structure as recited in claim 46 wherein the cap is selected from the group consisting of silicon and metal.

48. The MEMS structure as recited in claim 42, wherein the electrical trace is selected from the group consisting of doped polysilicon, and a metal.

49. The MEMS structure as recited in claim 48, wherein the metal is selected from the group consisting of tungsten, titanium, nickel, and alloys thereof, and aluminum, copper, silver, and gold.

50. The MEMS structure as recited in claim 42, wherein a bottom surface of at least one of the side walls of the cap is attached to the substrate.

51. The MEMS structure as recited in claim 42, wherein the sidewalls are connected to the substrate at a location between first and second terminal ends of the at least one electrical trace.

52. The MEMS structure as recited in claim 42 wherein the substrate comprises a nonconductive material.

53. The MEMS structure as recited in claim 52, wherein a portion of the at least one electrical trace is in electrical communication with the substrate.

54. The MEMS structure as recited in claim 42, wherein the substrate comprises a conductive material.

55. The MEMS structure as recited in claim 42, wherein the substrate further comprises a recess formed in the upper surface thereof.

56. The MEMS structure as recited in claim 55, wherein the movable MEMS element is disposed above and substantially aligned with the recess.

57. The MEMS structure as recited in claim 42, wherein the movable MEMS element comprises at least one conductive member attached to a nonconductive base.

58. The MEMS structure as recited in claim 57, wherein the nonconductive base is selectively etchable from the conductive member.

59. The MEMS structure as recited in claim 57 wherein the nonconductive base comprises one of silicon dioxide and silicon nitride.

60. The MEMS structure as recited in claim 42, wherein the substrate is selected from the group consisting of high resistivity silicon, crystalline sapphire, glass and ceramic.

61. The MEMS structure as recited in claim 42 wherein the substrate is selected from the group consisting of silicon, silicon carbide, gallium arsenide, and metal.

62. The MEMS structure as recited in claim 42, wherein the at least one conductive element is selected from the group consisting of silicon, silicon carbide, and gallium arsenide.

63. A MEMS structure disposed within a peripheral region comprising:

a substrate;

a stationary element extending from the substrate;

a movable MEMS element having a portion that is free from the substrate and positioned adjacent the stationary element such that a variable-sized gap separating the movable MEMS element from the stationary element defines a dimension having a size that changes in response to movement of the movable MEMS element, wherein the dimension extends substantially parallel to the substrate; and a cap attached to the substrate having upper and side walls that encapsulate the movable MEMS element and the stationary element.

64. The MEMS structure as recited in claim 63, further comprising at least one electrical trace having a first terminal end in electrical communication with the stationary element and a second terminal end in electrical communication with the peripheral region.

65. The MEMS structure as recited in claim 63, further comprising a second stationary element extending from the substrate and disposed adjacent the movable MEMS element; and a second electrical trace having a first terminal end in electrical communication with the second stationary element and a second terminal end in electrical communication with the peripheral region.

66. The MEMS structure as recited in claim 65, wherein the stationary elements are electrically isolated from each other.

67. The MEMS structure as recited in claim 63, wherein the stationary element is conductive.

68. The MEMS structure as recited in claim 63, wherein the movable MEMS element further comprises at least two conductive elements.

69. The MEMS structure as recited in claim 68, wherein the at least two conductive elements are electrically isolated from each other.

70. A MEMS structure surrounded by a peripheral region, the MEMS structure comprising:

a substrate;

at least one stationary element that is in mechanical communication with the substrate;

a movable MEMS element having a portion that is free from the substrate and positioned adjacent the stationary element such that a variable-sized gap extends substantially parallel to the substrate and separates the movable MEMS element from the stationary element; and at least one electrical trace having a first terminal end in electrical communication with the at least one stationary element and a second terminal end in electrical communication with the peripheral region, wherein the trace is disposed within an electrically insulating layer between the stationary element and the substrate.

71. The MEMS structure as recited in claim 70, wherein the movable MEMS element defines outer ends that are permanently attached to the substrate, and wherein the portion that is free from the substrate is connected between the outer ends.

72. The MEMS structure as recited in claim 70, further comprising a cap attached to the substrate inside the peripheral region having upper walls and side walls that encapsulate the at least one stationary element and the movable MEMS element.

73. The MEMS structure as recited in claim 72, wherein the second terminal end extends outside the cap.

74. A MEMS structure surrounded by a peripheral region, the MEMS structure comprising:

a substrate;

first and second stationary elements in mechanical communication with the substrate;

a movable MEMS element having a portion that is free from the substrate and positioned adjacent the stationary elements such that first and second gaps separating the movable MEMS element from the first and second stationary elements, respectively, define variable-sized dimensions that extend substantially parallel to the substrate; and first and second electrical traces having first terminal ends in electrical communication with the first and second stationary elements, respectively, and having second terminal ends in electrical communication with the peripheral region.

75. The MEMS structure as recited in claim 74, wherein the movable MEMS element defines outer ends that are permanently attached to the substrate, and wherein the portion that is free from the substrate is connected between the outer ends.

76. The MEMS structure as recited in claim 74, further comprising a cap attached to the substrate inside the peripheral region having upper walls and side walls that encapsulate the stationary elements and the movable MEMS element.

77. The MEMS structure as recited in claim 76, wherein the second terminal ends extend outside the cap.

78. The MEMS structure as recited in claim 77, wherein the second terminal ends are electrically isolated from each other.

79. The MEMS structure as recited in claim 74, wherein the movable MEMS element further comprises at least two conductive elements.

80. The MEMS structure as recited in claim 79, wherein the at least two conductive elements are electrically isolated from each other.

* * * * *